Dec. 24, 1968 J. J. RONGEN ET AL 3,418,590

SINGLE ENDED PUSH-PULL CLASS B AMPLIFIER WITH FEEDBACK

Filed July 9, 1965

INVENTORS
JACOBUS J. RONGEN &
ALPHONSUS M. PETERS
BY
Frank R. Trifari
AGENT

United States Patent Office 3,418,590

Patented Dec. 24, 1968

3,418,590

SINGLE ENDED PUSH-PULL CLASS B AMPLIFIER WITH FEEDBACK

Jacobus Johannes Rongen and Alphonsus Maria Peters, Nijmegen, Netherlands, assignors to North American Philips Company, Inc., New York, N.Y., a corporation of Delaware Filed July 9, 1965, Ser. No. 470,760
Claims priority, application Netherlands, July 11, 1964, 6407942
7 Claims. (Cl. 330—14)

ABSTRACT OF THE DISCLOSURE

A single ended push-pull amplifier with a phase inverting stage, in which the voltage at the junction of the output transistors is maintained by means of a negative feedback resistor between the junction and the base of the inverter, and in which the quiescent current in the output stage is maintained constant by means of a positive temperature coefficient resistor in the collector circuit of the inverter.

This invention relates to single-ended push-pull amplifying arrangements comprising a push-pull stage with two transistors connected in series between the terminals of the supply-voltage source and a phase-inverting stage which precedes it. The transistors of the phase-inverting stage and of the push-pull stage are directly connected together and are of the same conductivity type. A series-combination of a separating capacitor and a load is connected to the common point of the transistors of the push-pull stage.

An object of the invention is more particularly to provide an amplifier having a stabilized work-point and adapted to be manufactured in the solid-state technique.

The use of these techniques in which amplifying devices are provided on a single crystal, requires steps for stabilisation whereby the transistors are directly connected and of the same conductivity type. In fact, with this technique, a high-value capacitor would occupy an unduly large surface, and it is impossible in a simple manner to provide complementary transistors on the same crystal.

Several methods for work-point stabilisation are known. Thus, in a known arrangement having a push-pull amplifier and a phase-inverting stage in which the transistors are directly connected and of the same conductivity type a work-point stabilisation is obtained by maintaining the common point of the transistors of the push-pull stage at a constant potential by means of a DC negative feedback coupling from this point through a resistor to the base of the transistor of the phase-inverting stage. Further a push-pull amplifying device having only one output and a phase-inverting stage has sometimes been stabilised by providing a resistor of negative temperature coefficient between the two bases of the transistors of the push-pull stage.

According to the present invention the transistors of the push-pull stage are operated at an adjustment at which they are alternately conducting and cut off, the adjusted voltage at the common point of the transistors of the push-pull stage being maintained constant by means of a DC negative feedback coupling from this point through a resistor to a point of the arrangement, for example the base of the transistor of the phase-inverting stage, which precedes the push-pull stage. The quiescent current in the two transistors of the push-pull stage is maintained constant by including a temperature-dependent resistor of positive temperature coefficient in the collector circuit of the phase-inverting stage.

The invention underlies the following recognition:

The transistors of the push-pull stage are preferably operated at B-adjustment so that alternately one transistor is conducting or cut-off and the other transistor is cut-off or conducting. In the ideal case the voltage thus assumes half the value of the supply voltage. The current in the load circuit flows in one condition of the arrangement in opposite direction to that in the other condition. The capacitor is thus alternately charged and discharged. If the average charging and discharging currents were different and the steps according to the invention omitted, the direct voltage at the common point would no longer remain equal to half the supply voltage, which adjustment is optimum for maximum drive of the two transistors of the push-pull stage. Satisfactory operation of the arrangement is ensured in accordance wtih the invention by means of a two-fold stabilisation.

The voltage at the common point is stabilised by means of the DC negative feedback coupling from this point through a resistor to the base of the phase-inverting stage. If, for example, the voltage at the common point increases the base current of the phase-inverting stage increases so that this stage is driven further. The current in the collector circuit thus increases and causes a larger voltage drop across a resistor included in it. The base current of the transistor of the push-pull stage, which is connected to the collector of the phase-inverting stage thus increases so that, with constant output current, the voltage in the output circuit of this transistor decreases, thus counteracting the above-mentioned increase in voltage. The stabilisation of the quiescent current in the push-pull stage is obtained by means of the other stabilisation step, namely the resistor of positive temperature coefficient included in the collector circuit of the phase-inverting stage. If the temperature increases the DC preadjustment of the transistors in the push-pull output stage tends to increase since the $V_{BE}$ required for a given quiescent adjustment decreases at a higher temperature. This increase in direct current may occur due to the additional dissipation upon drive and is usually not acceptable in silicon transistors without the steps described.

Furthermore this effect may give rise to thermal instability. If the temperature increases the resistor of positive temperature coefficient will also acquire a higher value, however, so that the voltage drop across it increases with temperature. Due to the DC negative feedback coupling previously described, the voltage at the emitter of the transistor of the push-pull stage which is connected to the said resistor is stabilized. The voltage difference between the emitter and the base of the last-mentioned transistor thus decreases with temperature in accordance with the value $V_{BE}$ required for the desired adjustment of the quiescent current. However, the mean direct currents in the two transistors of the push-pull stage are forced to assume the same value due to the action of the said blocking capacitor and the first-mentioned stabilisation step so that the current in the other transistor of the push-pull stage is also stabilised.

In order that the invention may be readily carried into effect it will now be described in detail, by way of example, with reference to the accompanying diagrammatic drawing, in which.

Figure 1:
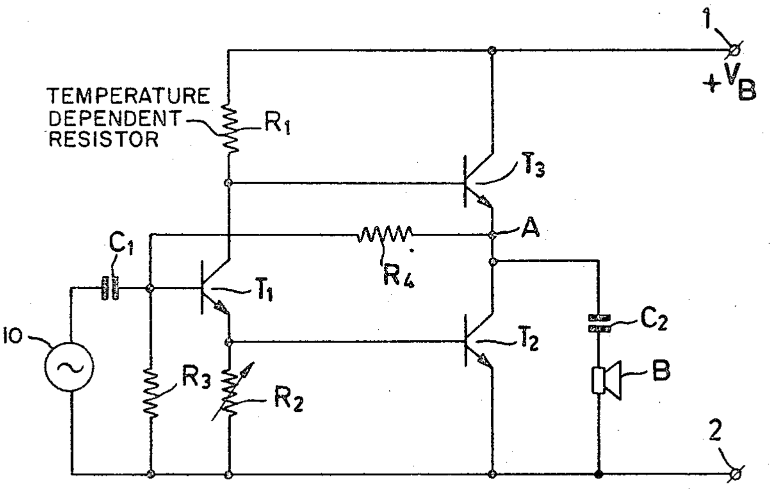
FIGURE 1 shows an amplifying arrangement according to the invention.

The signals to be amplified are applied from source 10 through a separating capacitor $C_1$ to the base of a transistor $T_1$ of the phase-inverting stage. The emitter of transistor $T_1$ is connected to the base of a transistor $T_2$ of the push-pull stage and the collector of transistor $T_1$ is connected to the base of a transistor $T_3$ of the push-pull stage.

The transistors $T_1$, $T_2$ and $T_3$ are of the same conductivity type (in the present example of the npn-type) and directly connected together.

The series-combination of transistor $T_2$ and transistor $T_3$ is connected between terminals 1 and 2 of the supply-voltage source.

A series-combination of a separating capacitor $C_2$ and a load B is connected to the common point A of the said transistors. The other end of this series-combination is connected to ground.

Further the emitter circuit of transistor $T_1$ includes a variable resistor $R_2$ and its collector circuit includes a temperature-dependent resistor $R_1$. The resistor $R_2$ serves to adjust the quiescent current of the push-pull stage. It is connected via a terminal to ground and resistor $R_1$ is connected to the terminal 1 of the supply-voltage source.

The common point A of the transistors $T_2$ and $T_3$ is connected through a resistor $R_4$ to the base of transistor $T_1$, $R_3$ constituting the connection of this base to ground.

The circuit operates as follows:

The signals amplified by transistor $T_1$ appear with opposite phases at the collector and emitter, respectively, of this transistor. Thus the push-pull transistors $T_2$ and $T_3$ are alternately switched due to the change of positive and negative peaks of the signals. The direct voltage energy of the supply source is thus converted into signal energy and given off to the load B. The point A preferably has an adjusted voltage which is equal to half the supply voltage (signal-ended push-pull circuit).

The arrangement is stabilized by the combination of two steps known per se.

Firstly the adjusted voltage at point A is maintained constant by the DC negative feedback coupling through the resistor $R_4$ to the base of transistor $T_1$ and thence through the resistor $R_3$ to ground.

Secondly the quiescent current flowing through the push-pull transistors is maintained constant by the temperature-dependent resistor $R_1$. This resistor has a positive temperature coefficient (PTC) of approximately ¼% per degree centigrade and is directly mounted on the push-pull stage. Due to the dissipation of energy the temperature of the transistors increases and, due to the thermal coupling, the temperature of the PTC resistor $R_1$ also increases. Its resistivity increases so that the current decreases and hence the voltage at the collector of the transistor $T_1$ decreases. The adjusted voltage at the base of transistor $T_3$ thus decreases so that the current in the output circuit also decreases. As previously mentioned, the current which has increased due to the higher temperature is thus compensated.

In the practical embodiment at least all of the transistors and the temperature-dependent resistor $R_1$ are provided on one crystal so that a very good thermal coupling between these elements is guaranteed. To this end, for example, a silicon crystal of n-type conductivity is used in which the transistors $T_1$, $T_2$ and $T_3$ are formed using the known planar technique, whereas the resistor $R_1$ is formed in the crystal body as a p-type layer provided with ohmic contacts.

Figure 2:
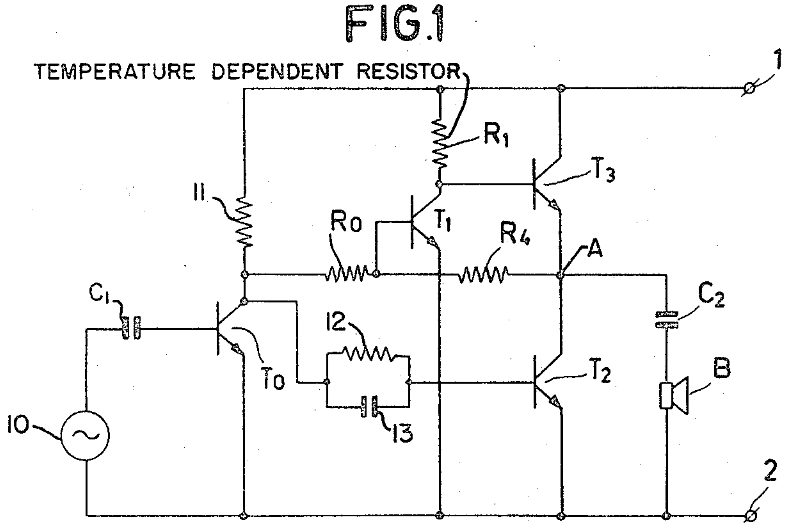
FIGURE 2 shows a further embodiment thereof.

FIGURE 2 shows another embodiment according to the invention. According to a known principle a negative feedback coupling is provided by means of a transistor $T_0$ in front of the arrangement including the phase-inverting stage and the push-pull stage so that the behaviour of the arrangement with regard to distortion is improved. This improvement is obtained due to the particular connection without loss of amplification.

This arrangement is stabilized in a similar manner as described above. The resistors $R_1$ and $R_4$ have the same function. The current adjusting the transistor $T_2$ is now determined by the voltage on the collector of the transistor $T_0$ which is connected through a resistor $R_0$ to the base of transistor $T_1$ and by resistor, 11 to terminal 1. The resistor $R_3$ of FIGURE 1 is thus replaced by the series-combination of the resistor $R_0$ and the transistor $T_0$, while for obtaining the negative feedback coupling the base of transistor $T_2$ of the push-pull stage is now connected to the collector of the transistor $T_0$ by way of the parallel circuit of resistor 12 and capacitor 13. The resistors $R_0$, $R_1$ and $R_4$ are so proportioned that the signal voltage at the base of transistor $T_1$, due to the negative feedback through the resistor $R_4$, has decreased so strongly that the signal voltage at the collector of transistor $T_1$ is exactly equal to, and in phase opposition with, the voltage at the collector at the transistor $T_0$.

What is claimed is:

1. A single-ended push-pull transistor amplifier comprising a source of operating voltage having first and second terminals, first and second transistors, means connecting the emitter-collector paths of said first and second transistors in series in that order between said first and second terminals, a series circuit of load circuit means and capacitor means connected to the junction of said first and second transistors, a phase inverting circuit comprising a third transistor, resistor means connected between said junction and the base of said third transistor, positive temperature coefficient resistor means connected between the collector of said third transistor and said second terminal, means connecting the collector of said third transistor to the base of said second transistor, a source of signals, and means applying said signals to the base of said third transistor, said phase inverting circuit further comprising means connected to apply signals to the base of said first transistor that are inverted in phase with respect to the signals applied to the base of said second transistor.

2. A single-ended push-pull transistor amplifier comprising a source of operating voltage having first and second terminals, first and second transistors, means connecting the emitter-collector paths of said first and second transistors in series in that order between said first and second terminals, a series circuit of load circuit means and capacitor means connected to the junction of said first and second transistors, a phase inverting circuit comprising a third transistor, resistor means connected between said junction and the base of said third transistor, positive temperature coefficient resistor means connected between the collector of said third transistor and said second terminal, means connecting the collector of said third transistor to the base of said second transistor, a source of signals, and means applying said signals to the base of said third transistor, said phase inverting circuit further comprising means connected to apply signals to the base of said first transistor that are inverted in phase with respect to the signals applied to the base of said second transistor and in which at least the said three transistors and the positive temperature coefficient resistor means are provided on one crystal.

3. A single-ended push-pull class-B transistor amplifier circuit comprising a phase inverting stage, a source of signals connected to said phase inverting stage, first and second transistors, means for direct coupling signals of opposite phase from said phase inverting stage to the bases of said first and second transistors, a source of operating voltage having first and second terminals, means connecting the emitter-collector paths of said first and second transistors in that order between said first and second terminals, a series circuit of load means and capacitor means connected to the junction of said first and second transistors, said phase inverting stage comprising a third transistor having its emitter connected to the base of said first transistor and its collector connected to the base of said second transistor, and means applying said signals to the base of said third transistors, negative direct current feedback means for maintaining the direct voltage at said junction constant comprising a resistor connected between said junction and the base of said third transistor, and means for maintaining the quiescent current in said first and second transistors substantially constant comprising positive temperature coefficient resistor means, and means connecting said resistor means between the collector of said third transistor and said second terminal.

4. A single-ended push-pull class-B transistor amplifier comprising a push-pull stage comprising first and second transistors, a phase inverting stage direct coupled to said push-pull stage for applying signals of opposite phase to the bases of said first and second transistors, said phase inverting stage comprising a third transistor, a source of signals, means applying said signals to said phase inverting stage comprising means for applying said signals to the base of said third transistor, the collector of said third transistor being direct current coupled to the base of said second transistor, a source of operating voltage having a first terminal connected to the emitter of said first transistor and a second terminal connected to the collector of said second transistor, the collector of said first transistor and the emitter of said second transistor being connected to a common junction, negative direct current feedback means for maintaining the direct voltage at said junction substantially constant comprising a resistor connected between said junction and said phase inverting stage, means for maintaining the quiescent current in said first and second transistors substantially constant comprising positive temperature coefficient resistor means and means connecting said resistor means between said second terminal and the collector of said third transistor means, and output circuit means connected to said junction.

5. The amplifier of claim 4 in which said resistor is connected between said junction and the base of said third transistor.

6. The amplifiers of claim 4 in which the emitter of said third transistor is direct current connected to the base of said first tarnsistor.

7. The amplifier of claim 4 wherein said phase inverting circuit comprises a fourth transistor comprising means for applying said signals to the base of said fourth transistor, direct current means for connecting the collector of said fourth transistor to the base of said first transistor, and a resistor connected between the collector of said fourth transistor and the base of said third transistor.

References Cited

UNITED STATES PATENTS

| | | | |
|---|---|---|---|
| 2,943,266 | 6/1960 | Belland | 330—18 XR |
| 3,246,251 | 4/1966 | Sheppard | 330—15 XR |
| 3,320,543 | 5/1967 | Hopengarten et al. | 330—15 |

ROY LAKE, *Primary Examiner.*

SIEGFRIED H. GRIMM, *Assistant Examiner.*

U.S. Cl. X.R.

330—15, 18, 22, 25, 28